United States Patent
Xu et al.

(10) Patent No.: US 9,343,357 B2
(45) Date of Patent: May 17, 2016

(54) SELECTIVE CONDUCTIVE BARRIER LAYER FORMATION

(71) Applicant: QUALCOMM Incorporated, San Diego, CA (US)

(72) Inventors: Jeffrey Junhao Xu, San Diego, CA (US); John Jianhong Zhu, San Diego, CA (US); Choh Fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/274,099

(22) Filed: May 9, 2014

(65) Prior Publication Data

US 2015/0249038 A1    Sep. 3, 2015

Related U.S. Application Data

(60) Provisional application No. 61/946,520, filed on Feb. 28, 2014.

(51) Int. Cl.
*H01L 23/48* (2006.01)
*H01L 23/52* (2006.01)
*H01L 29/40* (2006.01)
(Continued)

(52) U.S. Cl.
CPC .... *H01L 21/76847* (2013.01); *H01L 21/76831* (2013.01); *H01L 21/76843* (2013.01); *H01L 21/76855* (2013.01); *H01L 21/76856* (2013.01); *H01L 21/76858* (2013.01); *H01L 21/76864* (2013.01); *H01L 21/76879* (2013.01); *H01L 23/5226* (2013.01); *H01L 23/53223* (2013.01); *H01L 23/53238* (2013.01)

(58) Field of Classification Search
CPC .......... H01L 23/53223; H01L 21/76831; H01L 21/76843; H01L 21/76855; H01L 21/76858; H01L 23/53238; H01L 21/76856; H01L 21/76864; H01L 21/76879; H01L 23/5226; H01L 21/76847
See application file for complete search history.

(56) References Cited

U.S. PATENT DOCUMENTS

| 5,633,199 A * | 5/1997 | Fiordalice ......... H01L 21/76877 257/E21.585 |
| 6,348,402 B1 | 2/2002 | Kawanoue et al. |

(Continued)

FOREIGN PATENT DOCUMENTS

| EP | 1324383 A2 | 7/2003 |
| JP | H11340330 A | 12/1999 |

(Continued)

OTHER PUBLICATIONS

International Search Report and Written Opinion—PCT/US2015/016621—ISA/EPO—Sep. 15, 2015.

*Primary Examiner* — Thanh Y Tran
(74) *Attorney, Agent, or Firm* — Seyfarth Shaw LLP (57) ABSTRACT

A semiconductor device includes a die having a via coupling a first interconnect layer to a trench. The semiconductor device also includes a barrier layer on sidewalls and adjacent surfaces of the trench, and on sidewalls of the via. The semiconductor device has a doped conductive layer on a surface of the first interconnect layer. The doped conductive layer extends between the sidewalls of the via. The semiconductor device further includes a conductive material on the barrier layer in both the via and the trench. The conductive material is on the doped conductive layer disposed on the surface of the first interconnect layer.

16 Claims, 7 Drawing Sheets

(51) Int. Cl.
*H01L 21/768* (2006.01)
*H01L 23/522* (2006.01)
*H01L 23/532* (2006.01)

(56) References Cited

U.S. PATENT DOCUMENTS

| | | | |
|---|---|---|---|
| 6,839,219 B2 | 1/2005 | Mashiko et al. | |
| 7,235,884 B1* | 6/2007 | McElheny | H01L 21/76814 |
| | | | 257/762 |
| 7,338,871 B2* | 3/2008 | Lee | H01L 21/28512 |
| | | | 257/E21.162 |
| 7,732,331 B2 | 6/2010 | Kim et al. | |
| 7,952,171 B2 | 5/2011 | Pratt | |
| 8,519,539 B2 | 8/2013 | Jung et al. | |
| 2003/0104692 A1* | 6/2003 | Hau-Riege | H01L 21/76801 |
| | | | 438/658 |
| 2006/0003572 A1* | 1/2006 | Chen | H01L 21/76801 |
| | | | 438/622 |
| 2006/0084256 A1* | 4/2006 | Cabral | H01L 21/76843 |
| | | | 438/597 |
| 2006/0175705 A1 | 8/2006 | Tsutsue et al. | |
| 2007/0082488 A1* | 4/2007 | Katou | H01L 21/76843 |
| | | | 438/687 |
| 2009/0174067 A1* | 7/2009 | Lin | H01L 21/76808 |
| | | | 257/734 |
| 2014/0353841 A1* | 12/2014 | Reber | H01L 21/76877 |
| | | | 257/774 |
| 2015/0126027 A1 | 5/2015 | Matsumoto et al. | |

FOREIGN PATENT DOCUMENTS

| | | |
|---|---|---|
| JP | 2007173511 A | 7/2007 |
| JP | 2010141024 A | 6/2010 |
| WO | 2014013941 A1 | 1/2014 |

\* cited by examiner

SELECTIVE CONDUCTIVE BARRIER LAYER FORMATION

CROSS REFERENCE TO RELATED APPLICATION

The present application claims the benefit of U.S. Provisional Patent Application No. 61/946,520 filed on Feb. 28, 2014, in the names of Jeffrey Junhao Xu et al., the disclosure of which is expressly incorporated by reference herein in its entirety.

TECHNICAL FIELD

The present disclosure generally relates to integrated circuits (ICs). More specifically, the present disclosure relates to selective conductive barrier layer formation.

BACKGROUND

The process flow for semiconductor fabrication of integrated circuits (ICs) may include front-end-of-line (FEOL), mid-of-line (MOL), and back-end-of-line (BEOL) processes. The FEOL process may include wafer preparation, isolation, well formation, gate patterning, spacer, extension and source/drain implantation, silicide formation, and dual stress liner formation. The MOL process may include gate contact formation. The BEOL processes may include a series of wafer processing steps for interconnecting the semiconductor devices created during the FEOL and MOL processes. Successful fabrication and qualification of modern semiconductor chip products involves an interplay between the materials and the processes employed. In particular, the formation of conductive material plating for passive on glass (POG) devices in BEOL processes is an increasingly challenging part of the process flow.

When fabricating layers of conductive material on one another in a via, for example, a challenge that remains is resistance scaling. Because the minimum thickness specifications of certain conductive layers may be non-conducting, a high via resistance may make certain conductive barrier layers inoperable.

SUMMARY

A semiconductor device includes a die having a via coupling a first interconnect layer to a trench. The semiconductor device also includes a barrier layer on sidewalls and adjacent surfaces of the trench, and on sidewalls of the via. The semiconductor device also includes a doped conductive layer on a surface of the first interconnect layer. The doped conductive layer extends between the sidewalls of the via. The semiconductor device further includes a conductive material on the barrier layer in both the via and the trench. The conductive material is on the doped conductive layer disposed on the surface of the first interconnect layer.

A method for fabricating a semiconductor device includes depositing a conductive oxygen scavenging layer on sidewalls and adjacent surfaces of a trench and on sidewalls of a via of a die. The via may couple to a first interconnect layer and the trench. The method also includes applying a thermal treatment to the conductive oxygen scavenging layer to form a barrier layer on portions other than those contacting the first interconnect layer. The method further includes depositing a conductive material on the barrier layer in both the via and the trench. The conductive layer is on a doped conductive layer disposed on the exposed surface of the interconnect layer.

A semiconductor device includes a die having a via coupling a first interconnect layer to a trench. The semiconductor device also includes a barrier layer on sidewalls and adjacent surfaces of the trench, on sidewalls of the via and on an exposed surface of the first interconnect layer. The semiconductor device also includes a doped conductive layer on a surface of the first interconnect layer. The doped conductive layer extends between the sidewalls of the via. The semiconductor device further includes means for conducting on the barrier layer in both the via and the trench. The conducting means is on the doped conductive layer disposed on the surface of the first interconnect layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Conductive barrier layers may be formed within a via, or within a larger trench containing a via formed within a dual damascene wafer or die. Typical conductive barrier layers may be tantalum nitride (TaN) based copper (Cu). These conductive layer barriers may be two (2) to three (3) nanometers in thickness. Conductive barrier layers may face problems such as resistance scaling. In particular, these conductive barrier layers may becoming inoperable at high via resistances due to the minimum layer thickness values specified for forming effective diffusion barriers.

A conformal atomic layer deposition (ALD) fabricated TaN barrier is desired, but the minimum thickness of such a conductive barrier layer should be at least two nanometers to provide an effective copper diffusion barrier. The minimum thickness may prevent conductive materials, such as copper, from diffusing through the conductive barrier layer and mixing with other materials. Because a two nanometer TaN barrier is non-conducting, using this TaN barrier would result in a via open, thereby causing a circuit failure.

According to an aspect of the present disclosure, chemical vapor deposition (CVD) or ALD deposited aluminum (Al) selectively forms an aluminum oxide ($Al_2O_3$) copper barrier on a sidewall of a dual damascene via. The aluminum oxide, however, is not formed on the bottom of that via. That is, aluminum oxide is formed on the sidewalls of a via as a conductive barrier layer, while avoiding formation of aluminum oxide on the bottom surface of that via as a conductive barrier layer. In-situ thermal treatment at less than 400° C. may be applied to the aluminum layer to form aluminum oxide. In this arrangement, a via resistance with a selectively formed conductive barrier layer (e.g., aluminum oxide copper) may be significantly lower than the typical conductive barrier layer. For example, the conductive barrier layer may be a copper barrier, usually formed from a conformal atomic layer deposition of TaN.

Figure 1A:
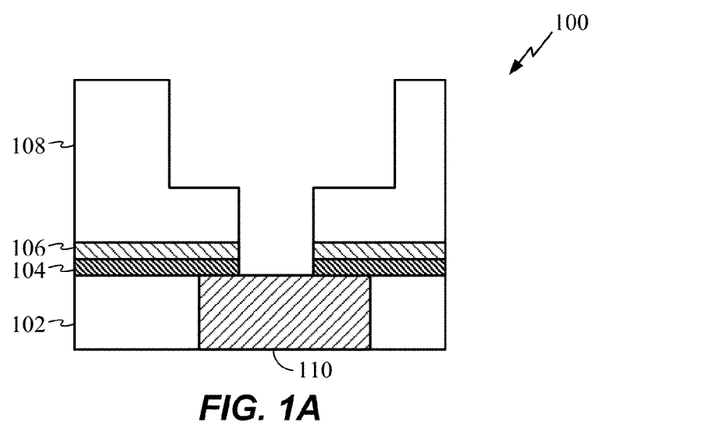
FIGS. 1A to 1C show cross-sectional views of a device fabricated from a typical conductive barrier layer formation process.
Figure 1B:
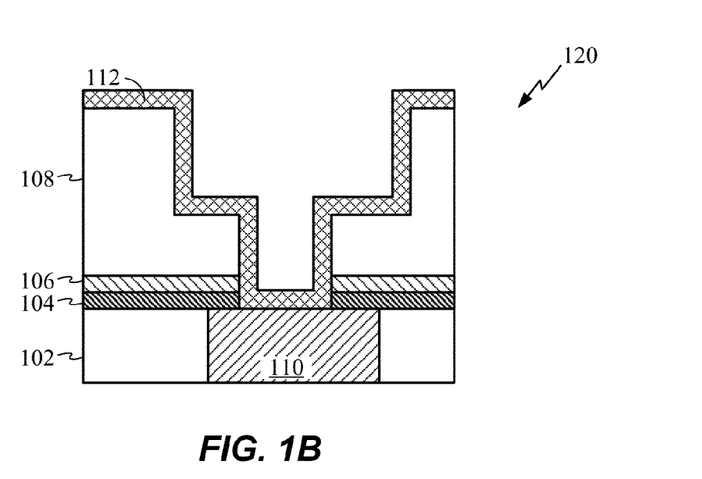
Figure 1C:
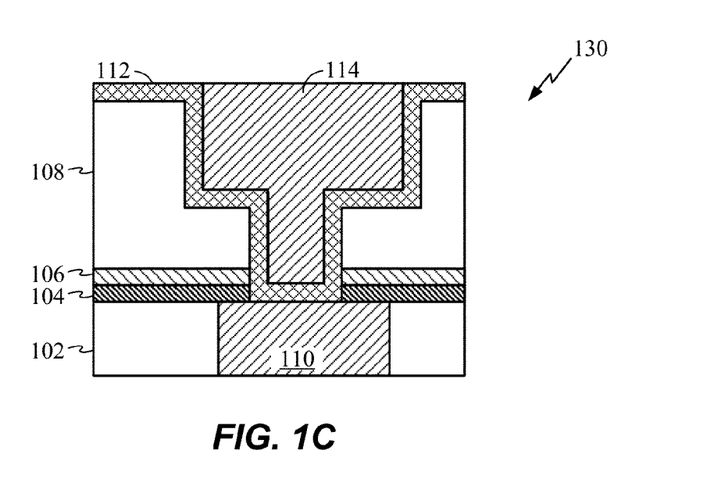

FIGS. 1A to 1C show cross-sectional views of a device fabricated from a conventional conductive layer barrier formation process.

As shown in FIG. 1A, a device 100 includes a first oxide layer 102, an intermediate layer 104, a cap layer 106, a second oxide layer 108 and a first interconnect layer 110. The device 100 may be a part of a dual damascene wafer or die. The first oxide layer 102 and the second oxide layer 108 may be a low-k material such as carbon or hydrogen doped silicon dioxide ($SiO_2$). In one configuration, the first oxide layer 102 and the second oxide layer 108 may be different materials, and one layer may not be a low-k material. Low-k materials have a low dielectric constant and may be used as insulator layers. The intermediate layer 104 may be carbon or oxygen doped silicon nitride (SiN). The cap layer 106 may be un-doped silicon dioxide. In one configuration, the intermediate layer 104 and the cap layer 106 form an etch-stop layer that includes silicon nitrogen-containing oxycarbides (SiCON). The first interconnect layer 110 may be conductive material such as copper (Cu). The first oxide layer 102, the intermediate layer 104, the cap layer 106 and the second oxide layer 108 may also all contain oxygen.

As shown in FIG. 1B, a barrier layer 112 is deposited on the device 120. The barrier layer 112 may be tantalum nitride (TaN) based copper. The barrier layer 112, however, may have a minimum thickness of two (2) nanometers to be an effective diffusion barrier. The barrier layer 112 may prevent copper or the material of an interconnect layer (e.g., the first interconnect layer 110 or the second interconnect layer 114, as shown in FIG. 1C) from diffusing through to the second oxide layer 108, the cap layer 106 or the intermediate layer 104. Diffusion of the copper layer or the interconnect layer material can lead to device failure.

In FIG. 1C, a device 130 includes a second interconnect layer 114 deposited on the barrier layer 112. The barrier layer 112 may have an adequate thickness (e.g., at least two nanometers) to operate as a diffusion barrier to prevent the second interconnect layer 114 from diffusing into the second oxide layer 108, the cap layer 106 and/or the intermediate layer 104. The barrier layer 112, however, may cause a high via resistance when contacting the first interconnect layer 110. This high via resistance may eventually render the barrier layer 112 inoperable and subsequently unable to perform its barrier functions.

Figure 2:
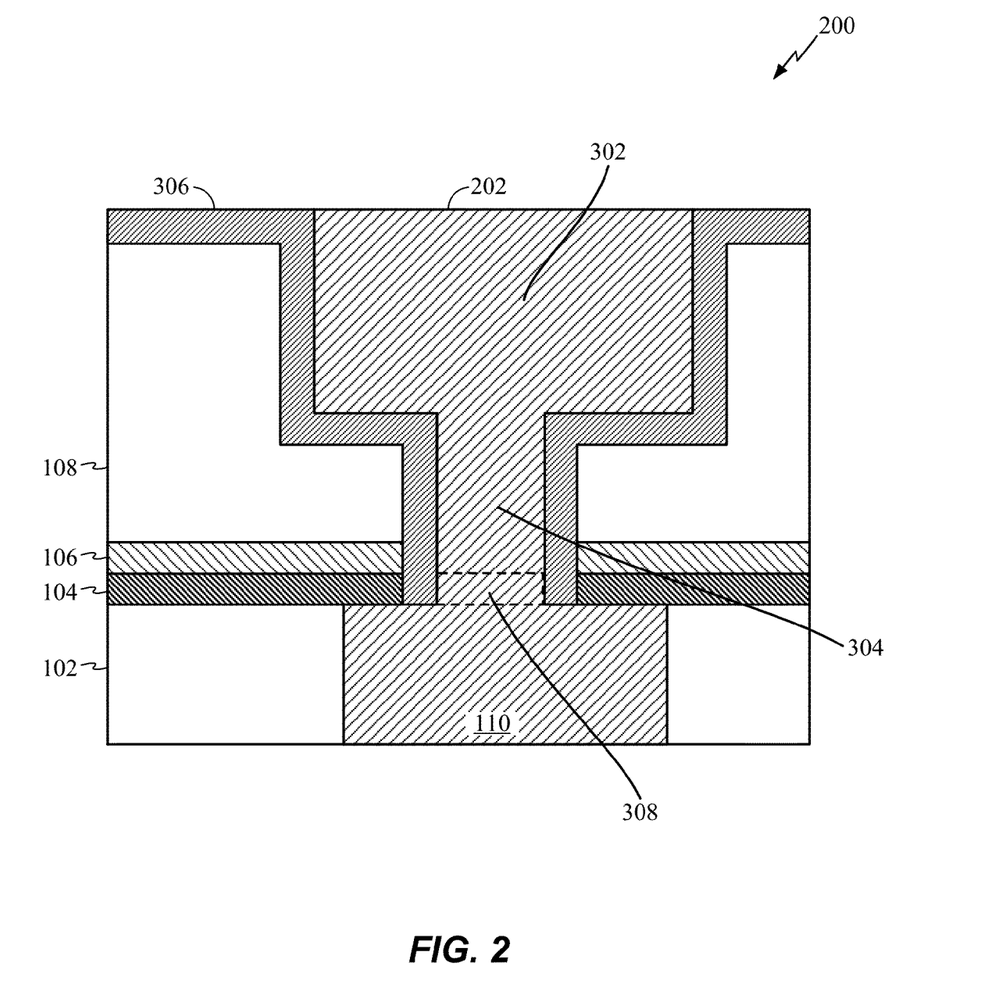
FIG. 2 shows a cross-sectional view of a device fabricated from a selective conductive barrier layer formation process according to one aspect of the disclosure.

FIG. 2 shows a cross-sectional view of a device 200 fabricated from a selective conductive barrier layer formation process according to one aspect of the disclosure. The device 200 includes a trench 302, a via 304, a treated barrier layer 306, a conductive layer 202 and a doped conductive layer 308, in addition to the components shown in FIGS. 1A-1C. As shown in FIG. 2, the treated barrier layer 306 is formed only on the sidewalls of the trench 302 and the via 304. Conversely, the barrier layer 112 shown in FIGS. 1B-1C is on a bottom surface of the via. Preventing a barrier layer from forming on a bottom surface of any via significantly lowers the via resistance. Furthermore, the treated barrier layer 306 still forms an effective diffusion barrier between the conductive layer 202 and the second oxide layer 108, the cap layer 106 and the intermediate layer 104.

The treated barrier layer 306 may be aluminum oxide ($Al_2O_3$), which acts as a very effective diffusion barrier material. The conductive layer 202 may be copper. The doped conductive layer 308 may be a copper-aluminum alloy, and is positioned between the conductive layer 202 and the first interconnect layer 110. The doped conductive layer 308 may extend horizontally between sidewalls of the via 304. The doped conductive layer 308 may also extend vertically between the bottom surface of the conductive layer 202 and the exposed top surface of the first interconnect layer 110, as further shown in FIGS. 3C-3D below.

FIGS. 3A-3D show cross-sectional views of a device fabricated from a selective conductive layer barrier formation process according to one aspect of the disclosure.

Figure 3A:
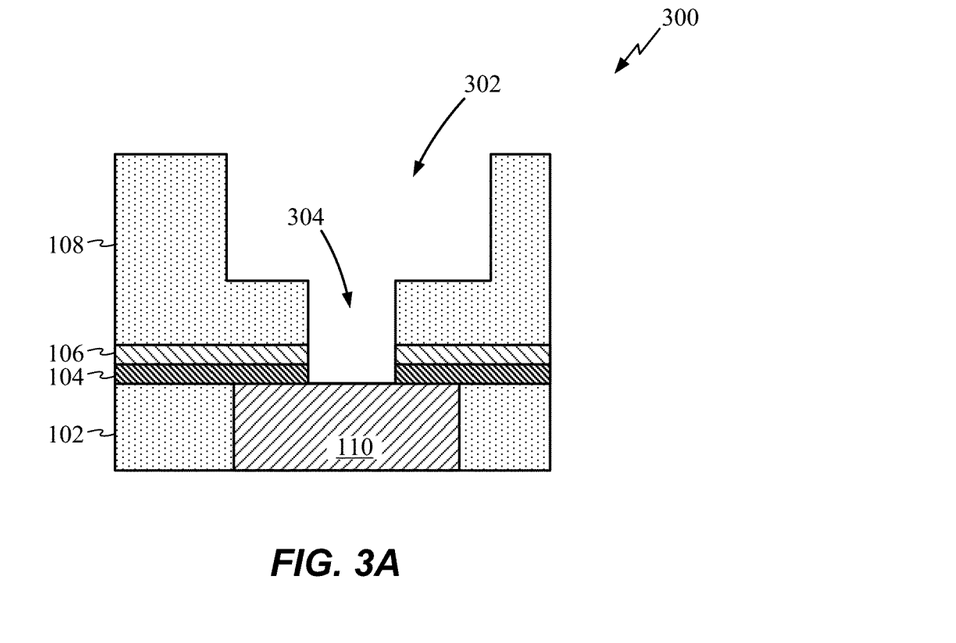
FIGS. 3A to 3D show cross-sectional views of a device fabricated from a selective conductive barrier layer formation process according to one aspect of the disclosure.

FIG. 3A shows the components from FIG. 1A. A device 300, however, further includes a trench 302 and a via 304 within the trench 302. The device 300 may also be a dual damascene wafer or die structure, or a portion of a dual damascene wafer or die structure.

Figure 3B:
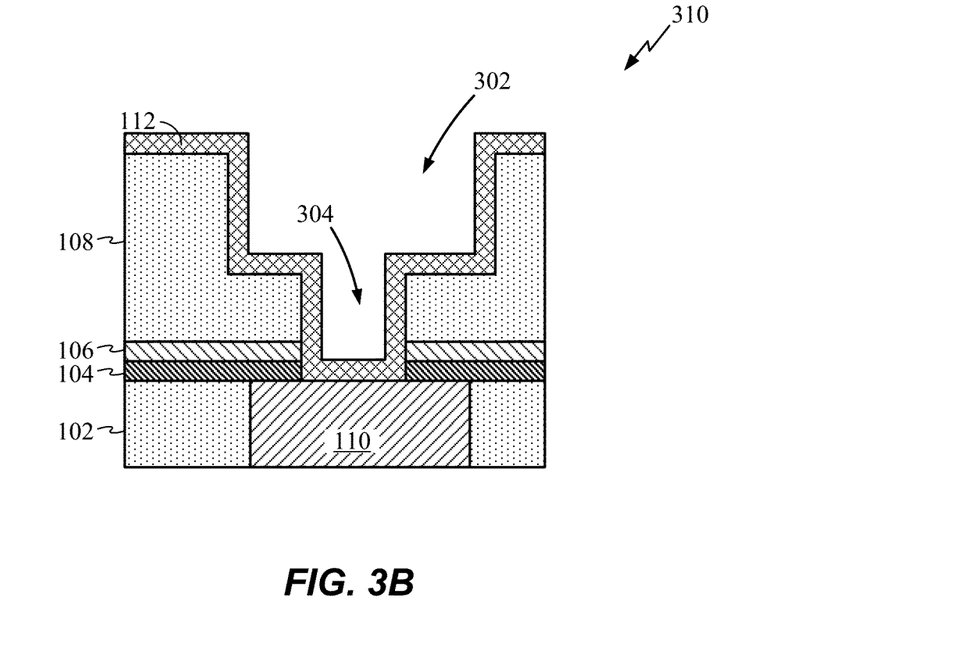

In FIG. 3B, a device 310 is shown with a barrier layer 112 deposited on surfaces of the trench 302 and the via 304. The barrier layer 112 may be aluminum (Al). The barrier layer 112 may be deposited by chemical vapor deposition (CVD) or atomic layer deposition (ALD) in a conformal fashion. The barrier layer 112 may be deposited as pure aluminum, or deposited as aluminum oxide ($Al_2O_3$) first, and then processed by a hydrogen ($H_2$) plasma treatment to convert the aluminum oxide into pure aluminum. The byproduct of such a hydrogen plasma treatment is water ($H_2O$), which can also be easily removed from the device 310 after processing. The barrier layer 112 contacts the bottom surface of the via 304, which also contacts the first interconnect layer 110.

Figure 3C:
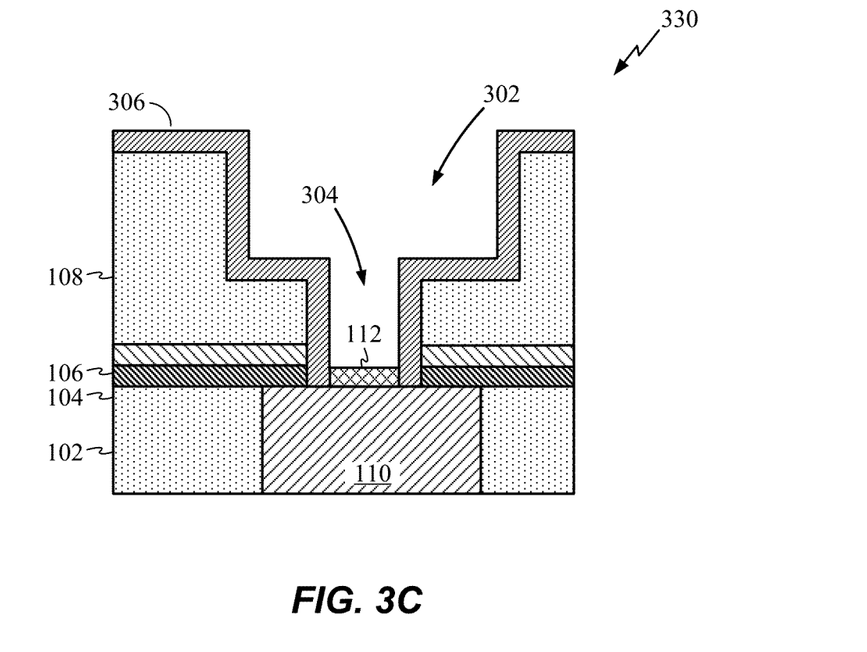

In FIG. 3C, a device 330 undergoes a thermal treatment that converts most of the barrier layer 112 into a treated barrier layer 306. The thermal treatment may be an in-situ thermal treatment process that takes place at a temperature less than or around 400° Celsius. The barrier layer 112 is transformed into the treated barrier layer 306 on the sidewalls of the trench 302 and the via 304, yet the bottom surface of the via 304 that contacts the first interconnect layer 110 remains as the barrier layer 112. That is, there is no formation of the treated barrier layer 306 on, or contacting, the first interconnect layer 110. The treated barrier layer 306 may be aluminum oxide ($Al_2O_3$).

Because the intermediate layer 104, the cap layer 106, and the second oxide layer 108 contain oxygen, the barrier layer 112 will scavenge oxygen from those layers to become a material such as aluminum oxide, which makes up the treated barrier layer 306. The barrier layer 112 on the bottom surface of the via 304 does not contact any oxygen-containing layers (e.g., 104, 106, 108) and only contacts the first interconnect layer 110, which does not have oxygen. Thus, when exposed to a thermal treatment, there is no oxygen to scavenge from the first interconnect layer 110 to undergo a chemical reaction that transforms the barrier layer 112 into the treated barrier layer 306. As a result, an untreated portion of the barrier layer 112 remains at the bottom surface of the via 304, contacting the first interconnect layer 110.

Figure 3D:
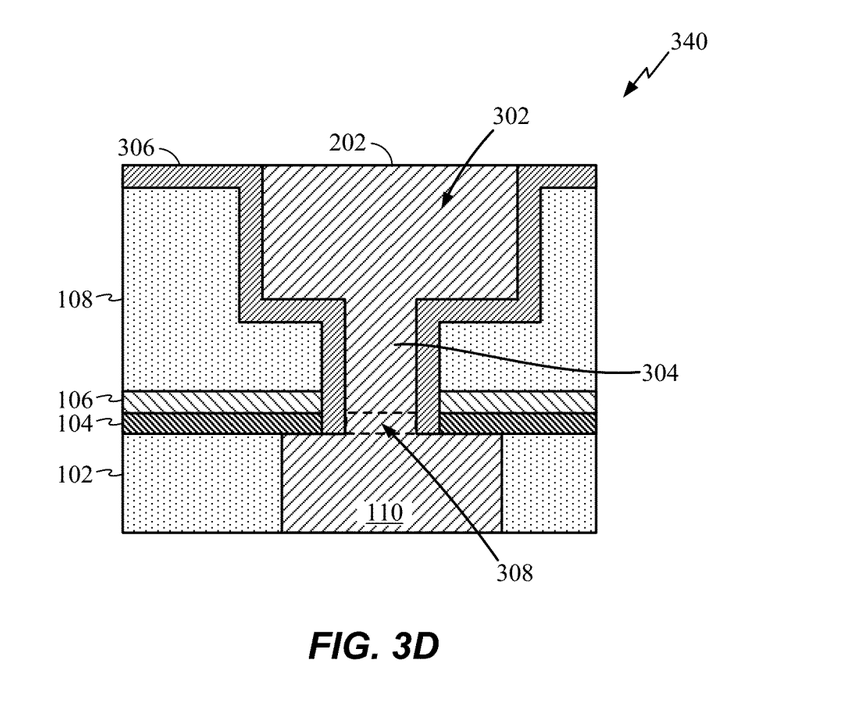

In FIG. 3D, an interconnect material fill process is performed on the device 340. A conductive material is deposited into the trench 302 and the via 304 of the device 340 to form a conductive layer 202. The barrier layer 112 from FIG. 3C also transforms into a doped conductive layer 308 when contacting the conductive layer 202. The barrier layer 112 (which may be aluminum) diffuses with the conductive layer 202 (which may be copper) to form the doped conductive layer 308. In this configuration, the doped conductive layer 308 is an alloy such as, for example, a copper-aluminum alloy. The doped conductive layer 308 may also contain both copper and aluminum, copper-doped aluminum and/or aluminum-doped copper.

The doped conductive layer 308 may also be formed on the surface of the first interconnect layer 110. The doped conductive layer 308 may also extend vertically between the conductive layer 202 and the exposed surface of the first interconnect layer 110. The doped conductive layer 308 may also extend horizontally between the sidewalls of the via 304. The doped conductive layer 308 may also be located between another via within the via opening 304 and the exposed surface of the first interconnect layer 110. Such a via may be bounded on both sides by the treated barrier layer 306. Such a via may also be formed as a result of additional deposited material within the via 304.

The surface of the first interconnect layer 110 may be the top surface of the first interconnect layer 110 initially exposed in FIG. 3A, but contacting the barrier layer 112 in FIG. 3B and contacting the untreated portion of the barrier layer 112 in FIG. 3C. The conductive layer 202 may also be conductive material poured into the trench 302 and the via 304 of the device 340.

Figure 4:
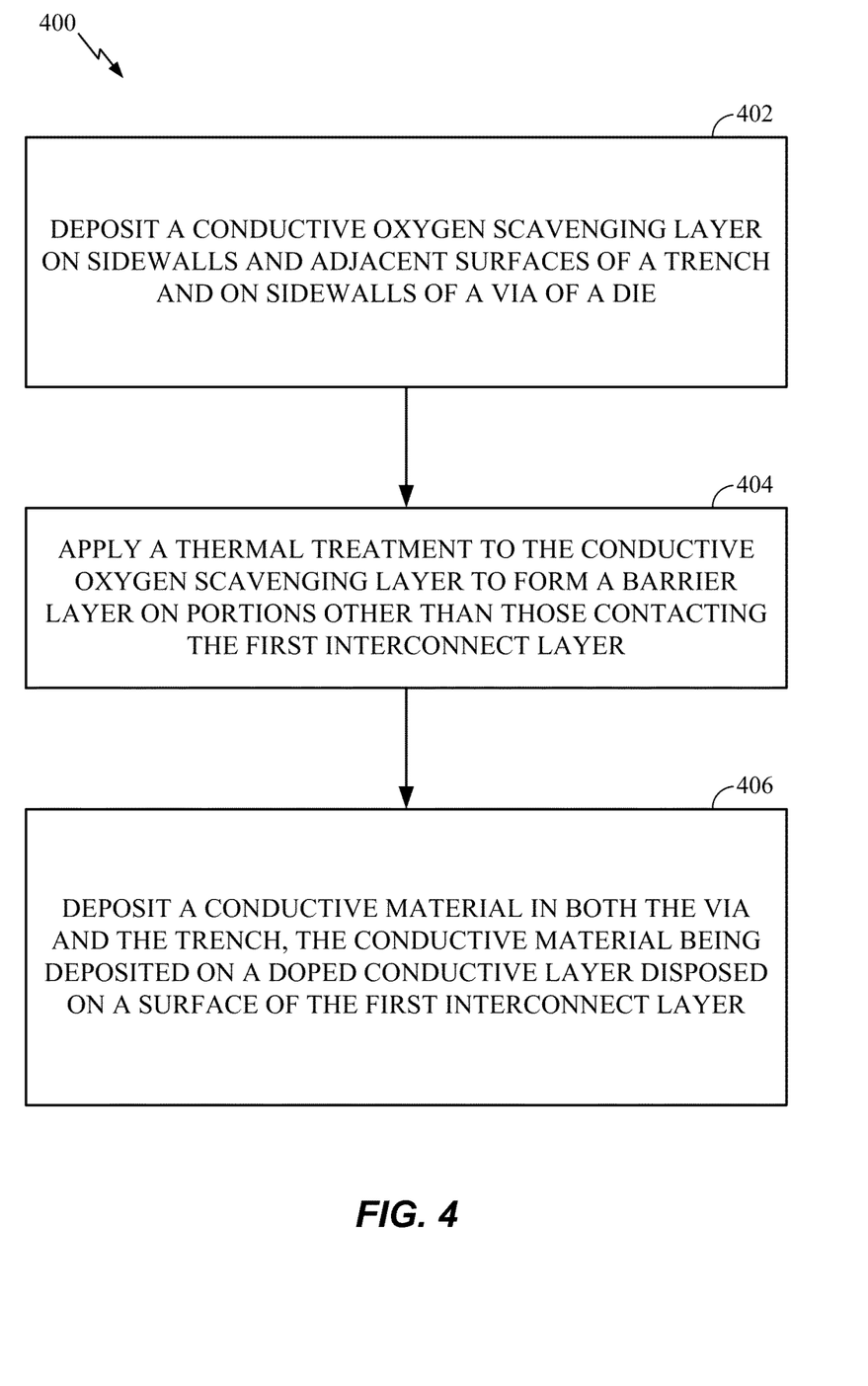
FIG. 4 is a process flow diagram illustrating a selective conductive barrier layer formation process according to aspects of the disclosure.

FIG. 4 is a process flow diagram illustrating a selective conductive barrier layer formation process 400 according to an aspect of the disclosure. In block 402, a conductive oxygen scavenging layer (e.g., barrier layer 112) is deposited on sidewalls and adjacent surfaces of a trench (e.g., trench 302). The conductive oxygen scavenging layer is also deposited on sidewalls of a via (e.g., via 304) of a die. As shown in FIG. 3A, the via couples a first interconnect layer (e.g., the first interconnect layer 110) to the trench.

In block 404, a thermal treatment is applied to the conductive oxygen scavenging layer to form a barrier layer (e.g., treated barrier layer 306) on portions other than those contacting the first interconnect layer. In block 406, a conductive layer (e.g., conductive layer 202) is deposited in both the via and the trench. The conductive layer is also on a doped conductive layer (e.g., doped conductive layer 308) disposed on the surface of the first interconnect layer. In one aspect, the doped conductive layer extends between the sidewalls of the via. This may be an extension in the horizontal direction or the x-axis. In another aspect, the doped conductive layer extends between the via and the surface of the first interconnect layer. This may be an extension in the vertical direction or the y-axis.

In one configuration, a semiconductor device includes a die having a via, a trench, and a first interconnect layer. The device also includes a barrier layer and a doped conductive layer on a surface of the first interconnect layer. The device also has means for conducting on the barrier layer in both the via and the trench. In one aspect of the disclosure, the conducting means may be the conductive layer 202. In another aspect, the aforementioned means may be any material or structure configured to perform the functions recited by the aforementioned means. In this aspect, the doped conductive layer extends between the sidewalls of the via. This may be a horizontal extension. In another aspect, the doped conductive layer extends between the via and the surface of the first interconnect layer. This may be a vertical extension.

In one implementation, the conductive material used for the various conductive material layers may be copper (Cu), or other conductive materials with high conductivity. For example, the first interconnect layer 110, the barrier layer 112, the second interconnect layer 114, the conductive layer 202, and the doped conductive layer 308 may include copper (Cu), silver (Ag), annealed copper (Cu), gold (Au), aluminum (Al), calcium (Ca), tungsten (W), zinc (Zn), nickel (Ni), lithium (Li) or iron (Fe). The aforementioned conductive material layers may also be deposited by electroplating, chemical vapor deposition (CVD), physical vapor deposition (PVD), sputtering, or evaporation.

The first oxide layer 102, the second oxide layer 108, the intermediate layer 104 and the cap layer 106 may be materials having a low k, or a low dielectric constant value, including silicon dioxide ($SiO_2$) and fluorine-doped, carbon-doped, and porous carbon-doped forms, as well as spin-on organic polymeric dielectrics such as polyimide, polynorbornenes, benzocyclobutene (BCB) and polytetrafluoroethylene (PTFE), spin-on silicone based polymeric dielectrics and silicon nitrogen-containing oxycarbides (SiCON). In one aspect, the first oxide layer 102 and the second oxide layer 108 may be a low-k material such as carbon or hydrogen doped silicon dioxide ($SiO_2$).

The first oxide layer 102 and the second oxide layer 108 may also be different materials, and one layer may be a material other than a low-k material. Low-k materials have a low dielectric constant and may be used as insulator layers. In one aspect, the intermediate layer 104 may be carbon or oxygen doped silicon nitride (SiN). In one aspect, the cap layer 106 may be un-doped silicon dioxide. In one configuration, the intermediate layer 104 and the cap layer 106 form an etch-stop layer that includes silicon nitrogen-containing oxycarbides (SiCON). These aforementioned layers may also be deposited by a spin-coating process, chemical vapor deposition (CVD), physical vapor deposition (PVD), sputtering, or evaporation.

Although not mentioned in the above process steps, photoresist, ultraviolet exposure through masks, photoresist development and lithography may be used. Photoresist layers may be deposited by spin-coating, droplet-based photoresist deposition, spraying, chemical vapor deposition (CVD), physical vapor deposition (PVD), sputtering, or evaporation. Photoresist layers may then be exposed and then etched by chemical etching processes using solutions such as Iron Chloride ($FeCl_3$), Cupric Chloride ($CuCl_2$) or Alkaline Ammonia ($NH_3$) to wash away the exposed photoresist portions, or dry etching processes using plasmas. Photoresist layers may also be stripped by a chemical photoresist stripping process or a dry photoresist stripping process using plasmas such as oxygen, which is known as ashing.

Although not described above, the method to selectively form conductive barrier layers may also include patterning a first trench interconnect material coupled to a first gate interconnect material at a first recess in order to form a first plate of a FinFET capacitive structure. The above-described selective conductive barrier layer formation process may be used to form a wide array of different devices such as inductors, capacitors, resistors, transformers, tuners, filters, diplexers, resonators, microelectromechanical system (MEMS) based structures and more.

Figure 5:
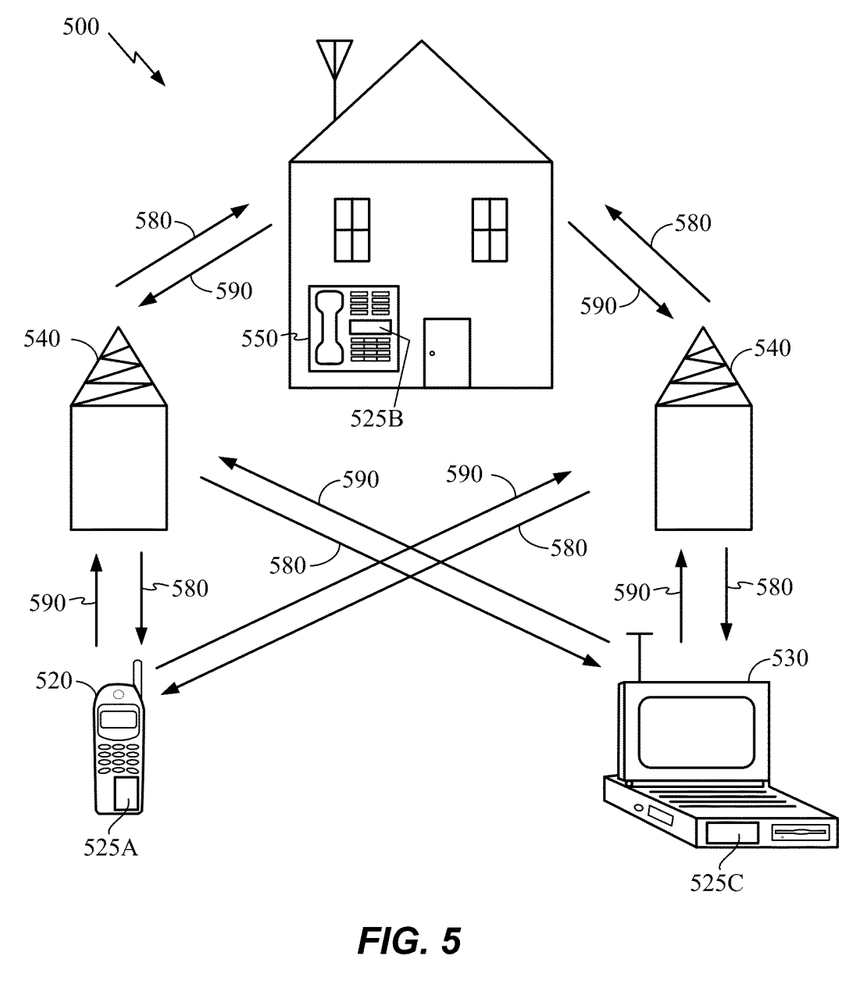
FIG. 5 is a block diagram showing an exemplary wireless communication system in which a configuration of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C, and 525B that include the disclosed devices (e.g., devices having selectively formed barrier layers). It will be recognized that other devices may also include the disclosed devices (e.g., devices having selectively formed barrier layers), such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 5 illustrates remote units according to the aspects of the disclosure, the disclosure is not limited to these exemplary illustrated units. Aspects of the disclosure may be suitably employed in many devices, which include the disclosed devices.

Figure 6:
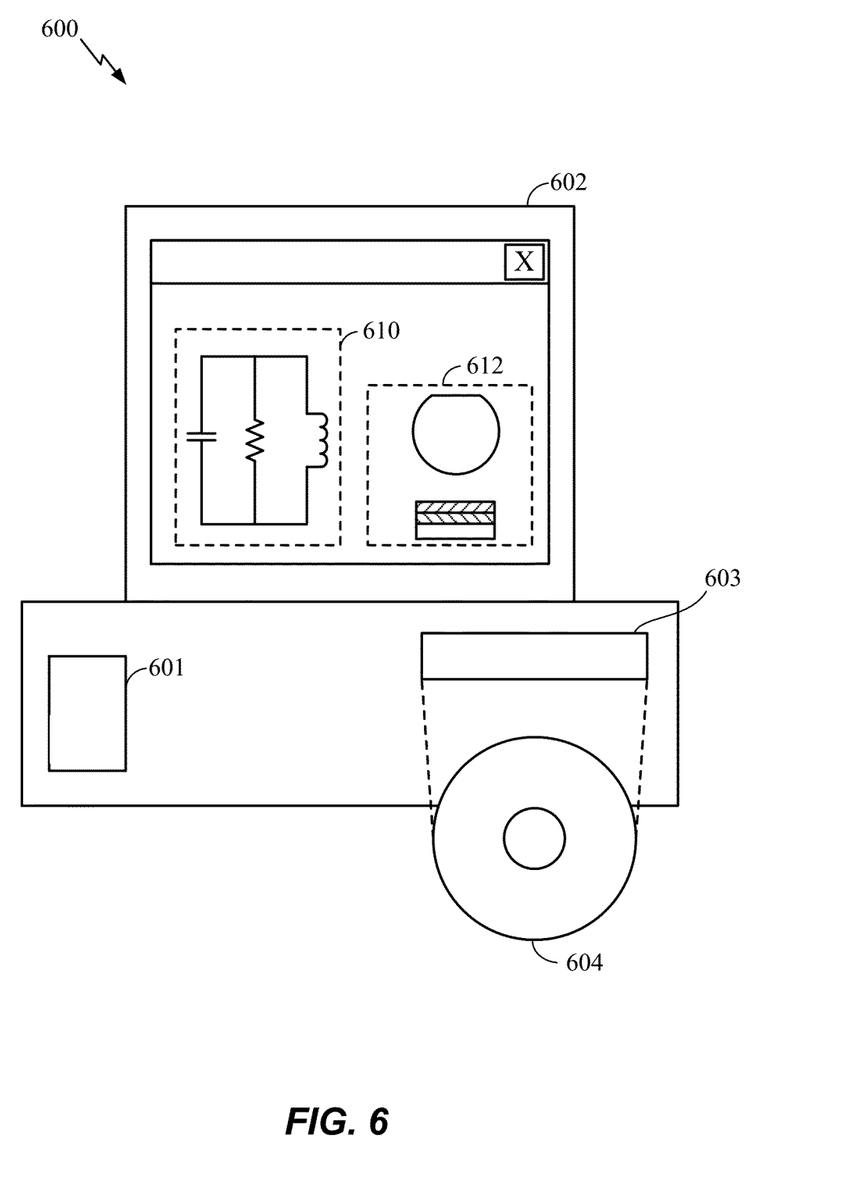
FIG. 6 is a block diagram illustrating a design workstation used for circuit, layout, and logic design of a semiconductor component according to one configuration.

FIG. 6 is a block diagram illustrating a design workstation 600 used for circuit, layout, and logic design of a semiconductor component, such as the devices disclosed above containing selectively formed barrier layers. A design workstation 600 includes a hard disk 601 containing operating system software, support files, and design software such as Cadence or OrCAD. The design workstation 600 also includes a display 602 to facilitate design of a circuit 610 or a semiconductor component 612 such as the disclosed device (e.g., device having selectively formed barrier layers). A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers or dies.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a die including a via coupling a first interconnect layer to a trench;
   a barrier layer on sidewalls and adjacent surfaces of the trench, and on sidewalls of the via, the barrier layer including a first sidewall portion and a second sidewall portion directly on a surface of the first interconnect layer;
   a doped conductive layer directly on the surface of the first interconnect layer, the doped conductive layer extending between the first sidewall portion and the second sidewall portion of the barrier layer on opposing sidewalls of the via; and
   a conductive material on the barrier layer in both the via and the trench, the conductive material disposed directly on a surface of the doped conductive layer opposite the surface of the first interconnect layer.

2. The semiconductor device of claim 1, in which the barrier layer comprises aluminum oxide ($Al_2O_3$).

3. The semiconductor device of claim 1, in which the conductive material comprises copper and aluminum.

4. The semiconductor device of claim 1, further comprising an etch stop layer on portions of the first interconnect layer, the etch stop layer comprising silicon nitrogen-containing oxycarbides (SiCON).

5. The semiconductor device of claim 1, in which the doped conductive layer comprises a copper aluminum alloy.

6. The semiconductor device of claim 1, in which the first interconnect layer comprises copper.

7. The semiconductor device of claim 1, in which the doped conductive layer also extends between the conductive material and the surface of the first interconnect layer.

8. The semiconductor device of claim 1 incorporated into at least one of a music player, a video player, an entertainment unit, a navigation device, a communications device, a personal digital assistant (PDA), a fixed location data unit, and a computer.

9. A semiconductor device comprising:
   a die including a via coupling a first interconnect layer to a trench;
   a barrier layer on sidewalls and adjacent surfaces of the trench, and on sidewalls of the via, the barrier layer including a first sidewall portion and a second sidewall directly on a surface of the first interconnect layer;
   a doped conductive layer directly on the surface of the first interconnect layer, the doped conductive layer extending between the first sidewall portion and the second sidewall portion of the barrier layer on opposing sidewalls of the via; and
   means for conducting in both the via and the trench on the barrier layer, the conducting means being directly on a surface of the doped conductive layer opposite the surface of the first interconnect layer.

10. The semiconductor device of claim 9, in which the barrier layer comprises aluminum oxide ($Al_2O_3$).

11. The semiconductor device of claim 9, in which the means for conducting comprises copper and aluminum.

12. The semiconductor device of claim 9, further comprising an etch stop layer on portions of the first interconnect layer, the etch stop layer comprising silicon nitrogen-containing oxycarbides (SiCON).

13. The semiconductor device of claim 9, in which the doped conductive layer comprises a copper aluminum alloy.

14. The semiconductor device of claim 9, in which the first interconnect layer comprises copper.

15. The semiconductor device of claim 9, in which the doped conductive layer also extends between the sidewalls of the via.

16. The semiconductor device of claim 9 incorporated into at least one of a music player, a video player, an entertainment unit, a navigation device, a communications device, a personal digital assistant (PDA), a fixed location data unit, and a computer.

* * * * *